United States Patent [19]

Togei et al.

[11] 4,060,796
[45] Nov. 29, 1977

[54] SEMICONDUCTOR MEMORY DEVICE

[75] Inventors: Ryoiku Togei; Akira Takei; Yoshihiko Hika; Kunihiko Wada, all of Kawasaki, Japan

[73] Assignee: Fujitsu Limited, Japan

[21] Appl. No.: 758,447

[22] Filed: Jan. 11, 1977

Related U.S. Application Data

[62] Division of Ser. No. 675,196, April 8, 1976.

[30] Foreign Application Priority Data

Apr. 11, 1975   Japan .................................. 50-43388

[51] Int. Cl.$^2$ .............................................. G11C 11/40
[52] U.S. Cl. .................... 365/183; 307/238; 357/23
[58] Field of Search ..................... 340/173 R; 307/238, 307/279; 357/23, 24

[56] References Cited

U.S. PATENT DOCUMENTS

| | | |
|---|---|---|
| 3,500,142 | 3/1970 | Kahng .............................. 340/173 R |
| 3,649,884 | 3/1972 | Haneta ............................. 340/173 R |

*Primary Examiner*—Terrell W. Fears
*Attorney, Agent, or Firm*—Staas & Halsey

[57] ABSTRACT

A semiconductor memory device provided with one transferring electrode, one gate electrode and one diode of a charge coupled device is produced by a process with a reduced number of steps of diffusion and patterning. Both electrodes consists of doped polycrystalline silicon and both are electrically connected to a resistive layer which consists of non-doped polycrystalline silicon. A potential barrier between the region of both electrodes is removed due to the resistive layer. Resistive layer is formed by utilization of a two-stage deposition of the polycrystalline silicon layer with appropriate mashing steps.

8 Claims, 7 Drawing Figures

SEMICONDUCTOR MEMORY DEVICE

This is a division, of application Ser. No. 675,196 filed Apr. 8, 1976.

This invention relates to a process for producing a semiconductor memory device, and, more particularly a semiconductor memory device employing a structure of a charge coupled device, hereinafter referred to as a CCD. Recently, attention has been concentrated upon employing CCD as a memory device.

In the general structure of CCD, for example, of a three-phase CCD, one gate electrode and a plurality of three electrodes for transferring electric charges are successively arranged on the top surface of an insulating material, which covers the semiconductor material substrate. When pulse voltages are applied to the electrodes, a distribution of electric potential is defined depending upon the magnitudes of the pulse voltages and the type and thickness of the insulating material layer. The distribution of the electric potential must include a barrier at a space between the two electrodes whereby said barrier inhibits the quick transfer of an electric charge from a region of one electrode to another region of a neighbouring electrode. This fact makes it difficult to reduce the access time of a memory device employing the CCD structure.

This invention is generally directed to a process for producing a semiconductor memory device, which comprises:

a semiconductor material substrate having one particular conductivity type and comprising on the surface thereof a doped layer with an impurity of the opposite conductivity type, one surface region of said substrate adjoining said doped layer being used as a gate region, and another surface region of said substrate adjoining said one surface region being used as a memory cell region;

an insulating layer placed on said substrate over said gate region and said memory cell region;

a gate electrode consisting of doped polycrystalline silicon, said gate electrode being placed on a part of said insulating layer over said gate region;

a memory cell electrode consisting of doped polycrystalline silicon, said memory cell electrode being placed on another part of said insulating layer over said memory cell region, and;

a resistive layer consisting of a non-doped polycrystalline silicon layer, placed on still another part of said insulating layer, located between said both electrodes and connected to said both electrodes.

In the memory device an electric charge of said opposite conductivity type is either injected from said doped layer through said gate region into said memory cell region or transferred from said memory cell region through said gate region to said doped region, depending upon the electric potential level in said substrate, which level is established by an electric field created by each of said electrodes through said insulating layer.

It is an object of this invention to provide a process for producing the semiconductor memory device, in which a barrier of the electric potential does not exist.

It is another object of the invention to provide a process, in which any layer is used as a mask for a part of the previously formed, underlying layer and the remaining unmasked part of this underlying layer is etched by an etchant which does not dissolve the masking layer, thereby decreasing the number of the photolithographic processes required.

It is still another object of the invention to provide a process, in which the number of diffusion steps is decreased.

A basic concept of the invention resides in the fact that a non-doped polycrystalline silicon layer is formed on the semiconductor material substrate in a continuous layer, and, further, an insulating layer, usually of $SiO_2$, is formed on a part of the polycrystalline silicon layer over a space between the gate electrode and the memory cell electrode. The insulating layer serves as a mask for a doping, which renders the unmasked parts conductive.

According to the process of the invention, a first insulating layer, usually although not necessarily an oxide layer of $SiO_2$, is first formed on a portion of the monocrystalline semiconductor material substrate, which portion is surrounded by a channel stop and electrically separated from the other portions by said channel stop. The first insulating layer is in fact formed on the entire top surface of the substrate. Since a part of the first insulating layer will be left in the sixth step of the process of the invention so that said one part masks the memory cell region and the gate region of the substrate, the first insulating layer must be formed at least over these regions.

The thickness of the first insulating layer depends on the capacity of the memory cell and gate region and can be from 300 to 2000 angstroms with regard to $SiO_2$.

Second, a first, non-doped polycrystalline silicon layer is placed on the first insulating layer, so that said first polycrystalline silicon layer is placed in the same location as that of the memory cell electrode. The polycrystalline silicon is first placed over the entire surface of the substrate in a manner such that the polycrystalline silicon is typically deposited by the decomposition of silane at an elevated temperature of approximately 600° C. The polycrystalline silicon is then selectively removed in the fourth step of the process according to the invention.

Third, the second insulating layer, usually although not necessarily an oxide layer of $SiO_2$, is formed on the first polycrystalline silicon electrode by thermal oxidation.

Fourth, a part of both the second insulating layer and the first polycrystalline silicon layer is removed to expose a part of the first insulating layer over a region of the substrate, in which the gate and the diode will be located. The remaining layers are therefore selectively placed in the location of the memory cell electrode and the resistance layer.

Fifth, a second, non-doped polycrystalline silicon layer is formed over a part of each of the first and second insulating layers in a manner such that the second, non-doped silicon layer masks both said parts above the resistance layer and the gate region.

Sixth, the unmasked parts of the first and second insulating layers, are removed by an etchant which dissolves these insulating layers but does not effectively dissolve the polycrystalline silicon layer, thereby exposing a part of the first, non-doped polycrystalline silicon layer and the substrate.

Finally, an impurity of the opposite conductivity type is introduced into the exposed parts of the first, non-doped polycrystalline silicon layer and substrate, as well as the second, non-doped polycrystalline silicon layer. In the step of introducing the impurity, the nonetched part of the second insulating layer, which part had, in the fifth step, been masked by the overlying of the second polycrystalline silicon layer for protection against the etchant, now masks the underlying part of the first, non-doped polycrystalline silicon layer for protection against the impurity. Accordingly, the exposed polycrystalline silicon becomes conductive enough for serving as an electrode, and the doped layer is formed in the substrate. The masked part of the first, non-doped silicon layer is protected from doping and thus serves as a resistive layer.

The invention is further illustrated in detail by way of several embodiments thereof in connection with the drawings, in which.

The starting point of the process is at the substrate of the monocrystalline semiconductor material 1, which is preferably silicon. However, it should be noted that any semiconductor material adapted for conducting electrical charges can be used with the invention. It should also be noted that the drawings are schematically drawn to illustrate the principles of the invention.

Hereinafter, the semiconductor material and all the other formed layers on it will be collectively referred to as a wafer.

Figure 1:
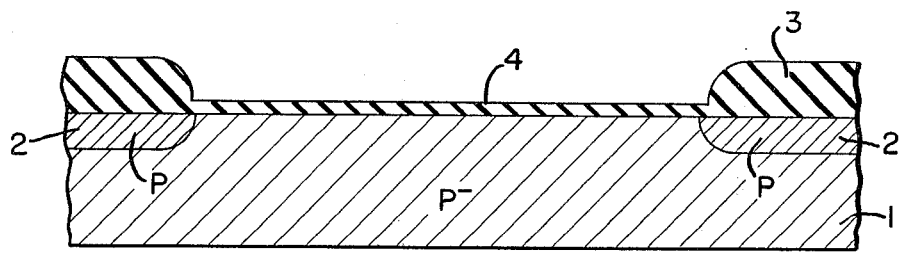
FIGS. 1 through 5 illustrate the process of the present invention, by which the elements of the memory device are produced.

In FIG. 1, the substrate 1 possesses a conductivity of a P-type and a concentration of impurities usually about $10^{15}$ atoms per cubic cm$^3$. This concentration of the impurity is relatively lower than the concentrations of the impurity in the hereinafter illustrated channel stop layers, and hence, the substrate is designated in the drawings as a P$^-$-type. It is obvious that all elements of the wafer can be of conductivity types opposite from the conductivity types described in the specification.

An impurity such as boron is introduced into a part of the substrate 1 to form a P-type layer 2 (FIG. 1) having a concentration usually of $5 \times 10^{16}$ atoms of boron per cubic centimeter. The P-type layer extends in a closed path around the other part of the substrate 1, in which the memory device will be formed, and thus serves as a channel stop.

The wafer contains channel stop layers, which separate the memory devices from each other. A process for producing the memory device in a region surrounded by the channel stop layer is described hereinafter. During the formation of the P-type channel stop layer 2, a thick oxide layer 3 of SiO$_2$, usually about 1 micron thick is formed on the channel stop 2. A top surface of the wafer surrounded by the channel stop layer 2 is protected by an oxide layer from the diffusion of the channel stop and the first insulating layer 4, usually consisting of SiO$_2$, is formed on the substrate after removing the oxide layer. The SiO$_2$ layer 4 is thermally grown on the top surface of substrate 1, usually grown to a thickness of from 1000 to 1500 angstroms.

Figure 2:
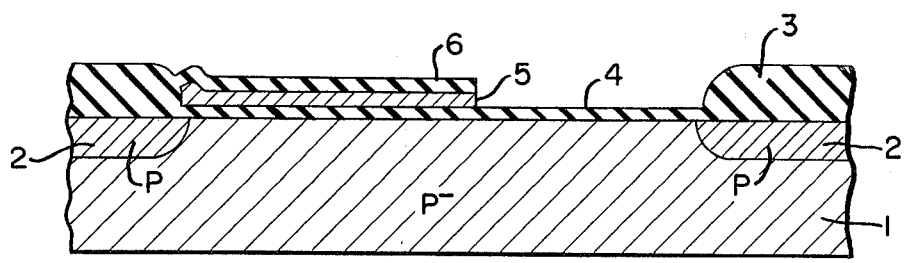

In FIG. 2, a non-doped polycrystalline silicon layer 5 and a SiO$_2$ layer 6 are selectively placed over a region of the substrate, in which the memory cell is defined by an electric potential distribution. The polycrystalline silicon 5 usually forms a thickness of, for example, 0.5 microns, caused by the decomposition of silane. The polycrystalline silicon layer 5 will serve as an electrode to control the electric potential distribution of the underlying substrate, after doping the silicon with an impurity rendering the polycrystalline silicon conductive. In order to create a structure as seen in FIG. 2, the non-doped polycrystalline silicon 5 is deposited on the entire surface of the SiO$_2$ layer 4 either by evaporation or by CVD. Subsequently, the SiO$_2$ layer 6 is formed by oxidizing the entire surface of the silicon layer 5 at an elevated temperature, usually at 1000° to 1100° C. The SiO$_2$ layer 6 is selectively removed to leave only the required part and to expose one part of the non-doped polycrystalline silicon layer 5. The exposed part of the silicon layer is now removed by an etchant, usually a solution of HF and HNO$_3$, while the remaining SiO$_2$ layer masks the underlying polycrystalline layer against the etchant.

Figure 3:
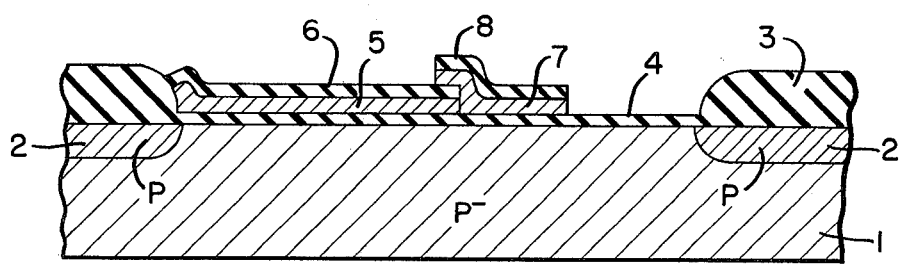

In FIG. 3, a non-doped polycrystalline silicon layer 7 is deposited on the entire top surface of the wafer, usually to a thickness of from 0.2 to 0.5 microns. The now deposited, non-doped polycrystalline silicon 7 is also deposited on the borders of the previously deposited polycrystalline silicon 5 and the SiO$_2$ layer 6. Accordingly, a continuous non-doped polycrystalline silicon layer, which consists of layers 5 and 7, is formed on the SiO$_2$ layer 4.

A SiO$_2$ layer 8 is formed at an elevated temperature of 1000 to 1100° C over the entire surface of the silicon layer 7 by oxidation. The SiO$_2$ layer 8 is usually from 500 to 2300 angstroms thick. A structure shown in FIG. 3, in which the non-doped polycrystalline silicon layer 7 and the SiO$_2$ layer 8 mask both the underlying layer 4 above the gate region and a part of the non-doped polycrystalline silicon 5, is created by first selectively removing the SiO$_2$ layer 8 and then removing the exposed, non-doped polycrystalline silicon 7, while the overlying SiO$_2$ layer 8 is being used as a mask against an etchant of silicon. The remaining polycrystalline silicon 7 will serve as a gate electrode after doping the silicon with an impurity.

Figure 4:
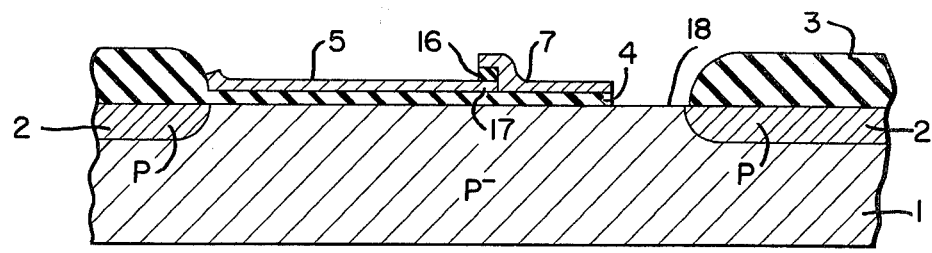

The wafer having a structure as seen in FIG. 3 is dipped in an etching solution capable of dissolving the SiO$_2$ but not the polycrystalline silicon, usually a er, which underlies below the polycrystalline silicon layer 7, is protected from the etching by virtue of the masking effect of the non-doped polycrystalline silicon 7. A structure as shown in FIG. 4 is, therefore, obtained. It is to be noted that a part 16 (FIG. 4) of SiO$_2$ layer 6 is left under the non-doped polycrystalline layer 7. The remaining part 16 of SiO$_2$ layer 6 masks a part 17 of the underlying non-doped polycrystalline silicon layer 5 beneath the SiO$_2$ layer 6. This masked part 17 of the non-doped polycrystalline silicon layer 5 will serve as a resistive layer which connects the memory cell electrode 5 to the gate electrode 7. This resistive layer 17 is usually from 1 to 3 microns in length, and has a width corresponding to the usual width of the electrodes of the memory device. All of the polycrystalline layers 5 and 7 are exposed except for the masked part 17 of layer 5, in addition to a part of the substrate 1.

Figure 5:
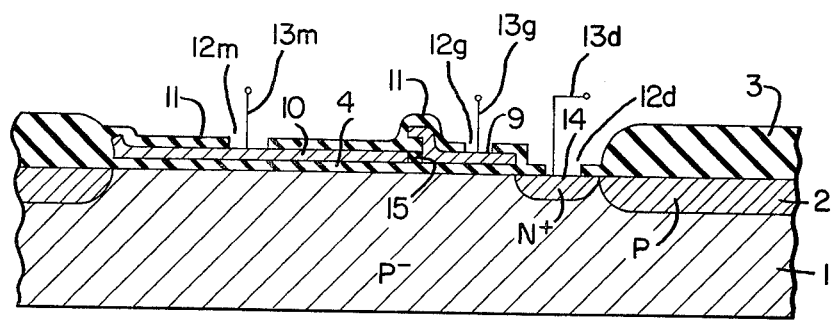

An impurity having the opposite conductivity type from the conductivity type of the substrate is introduced into the exposed parts either by diffusion or by ion-implantation. The exposed part 18 of the substrate 1 is heavily doped usually to a concentration of about $10^{20}$ atoms per cubic centimeter and thus is designated as the N$^+$-type doped layer 14 (FIG. 5). The exposed part of polycrystalline silicon 7 (FIG. 4) and the exposed part of the polycrystalline silicon 5 are rendered with a suitable conductivity to serve as electrodes of memory cell 10 and gate 9, respectively (FIG. 5).

The masked part 15 (FIG. 5) of the non-doped polycrystalline silicon 5 (FIG. 4) is protected from introduction of the impurity by remaining part 16 of $SiO_2$ layer 6. In order to assure the protection effect of the remaining part 16 of $SiO_2$ layer 6, this layer should be at least 800 angstroms thick with regard to the diffusion, and several thousands of angstrom thick with regard to the ion-implantation.

An oxide layer 11 (FIG. 5) of $SiO_2$ is formed on the top surface of the wafer during the introduction of the impurity.

Windows 12 m (memory cell) and 12 g (gate) are formed in the $SiO_2$ layer 11 to expose portions of the doped polycrystalline silicon memory cell 10 and gate 9, and a window 12 d (diode) is formed in the $SiO_2$ layer 11 to expose the N+-type diffused layer 14. The electrical leads 13 g, d, m are brought into electrical contact with the three exposed members, usually by evaporating aluminum followed by selective etching. The non-doped part 15 of the polycyrstalline silicon 5 (FIG. 4) is located between and connected to the gate electrode 9 and the memory cell electrode 10, and hence can be considered as a resistive layer connected between both electrodes.

In another embodiment of the invention, MOS transistors associated with the circuitry of the memory device are formed on the same body with the memory device and are simultaneously formed with the steps of producing a memory device.

Although not described in order to avoid unnecessarily complicating this description, it is obvious that the selective placing and etching in the process of the invention are performed by a well-known photolithographic technique.

The memory device employing for example, a P-type semiconductor substrate of a structure as shown in FIG. 5 is operated as follows. The memory cell and doped layer are maintained at different, positive electric potentials in a normal state. The memory is performed on the presumption that information "1" is storing electrons in the memory cell.

Write

Figure 6:
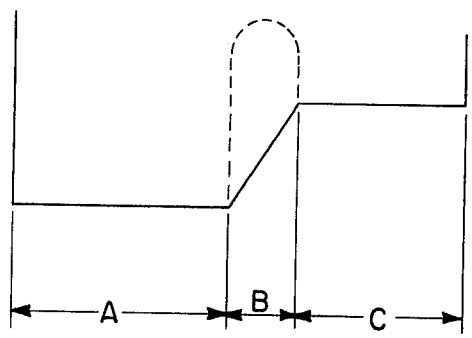
FIGS. 6 and 7 illustrate an electric potential distribution within the substrate.

As shown in FIG. 6, at the instant of writing information "1" a pulse voltage of zero value is applied to the doped layer 14 (FIG. 5) and gate electrode 9 is maintained at positive electric potential. The voltage applied to the gate is lower than that of the memory cell. As a result of the applied voltages, the electric potential distribution is formed in the memory cell region A, the non-doped polycrystalline silicon B, and the gate region C of the substrate, as shown by the solid line of FIG. 6. Due to the presence of non-doped polycrystalline silicon between the regions A and C, the linear potential distribution is formed in the region B. The gradient of this distribution in the region B depends upon the resistance value of the non-doped polycrystalline silicon. The electric charge is transferred from the region C to the region A through the region B. In accordance with the conventional device, the distribution of potential in the region B is as shown by the dotted line in FIG. 6. Accordingly, the peak of the electric potential at the region B acts as a barrier, which lowers the transferring speed of the electric charge. From the comparison of both the solid and dotted lines of FIG. 6, it is clear that the transferring speed of the electrical charge in the memory device produced by a process of the present invention is higher than that produced by the conventional process.

An information "0", is defined as the non-existence of an electric charge in the memory cell. The information "0" can be written by applying a positive pulse voltage to the gate 9, while positive voltages of the memory cell and the doped layer are maintained.

Read

The electric potential of the memory cell drops to zero and is maintained at this state, while the positive pulse voltage is applied to the gate electrode.

Figure 7:
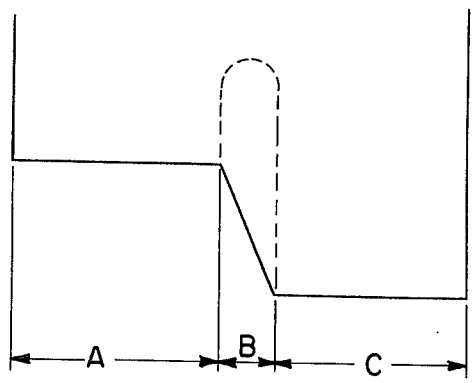

In FIG. 7, as a result of the applied voltages, the electric potential distribution is formed in the memory cell region A, the non-doped polycrystalline silicon B, and the gate region C of the substrate, as shown by the solid line in FIG. 7. Due to the presence of non-doped polycrystalline silicon between the regions A and C, the linear potential distribution is formed in the region B. The electric charge is transferred from the region A to the region B and is injected into the region C.

Contrary to the device produced by the process of invention, the conventional device possesses a peak of electric potential as shown by the dotted line in FIG. 7. From the comparison of the solid and dotted lines of FIG. 7, it can be seen that the transfer speed of electric charge is higher in the device produced by the method of the present invention than by the conventional process.

The electric potential of the N+-type doped layer 14 (FIG. 5) is lowered by an injection of the electric charge from the memory cell region to the doped layer. The voltage is lowered according to the quantity of the injected charge. The lowered electric potential is detected by a sensing amplifier (not shown) connected to the lead 13 d (FIG. 5), thereby reading the information which has been stored in the memory cell. Immediately after the detection of voltage being lowered, usually after several tens of nanosecond, an electric potential of the N+-type doped layer 14 (FIG. 5) is set at zero value, and, subsequently, usually after several hundreds of nanosecond, the electric potential of the memory cell is restored to the positive value, so that an electric charge is again injected into the memory cell region.

In a case where the information "0" is stored in the memory cell, the positive electric potential of the doped layer 14 (FIG. 5) is unchangeably maintained, because no electric charge is injected into the doped layer 14. Since the memory cell remains positive in a normal state, the electric potential of the memory cell is restored, as stated above, to a positive value after the READ period. In this case, no electric charge is injected into the memory cell, because the potential of the $N^{30}$-type doped layer is unchangeably maintained.

Accordingly, it is possible to read the information of the memory cell without destroying the effectiveness of the memory cell.

Refresh

Since the memory cell has a positive electric potential during the storage of the information, minority carriers are generated in the memory cell with the result being that the "0" state is changed to the "1" state. Accordingly, the memory cell must be periodically, usually every several tens of milliseconds, refreshed by means of dropping the potential of the memory cell electrode to zero.

The refreshing is performed in the same manner as that in the reading of the information. Namely, the electric potential of the memory cell drops to zero, while the positive pulse voltage is applied to the gate electrode thereby keeping the minority carriers, which cause dark current, away from the memory cell region. The electric charge stored in the memory cell region is injected into the doped layer 14 (FIG. 5). The injected charge is returned to the memory cell by the same methods as in the reading. Immediately after the detection of a change in voltage, an electric potential of the $N^{30}$-type doped layer 14 (FIG. 5) is set at zero value, and, subsequently the electric potential of the memory cell is restored to a positive value, so that the electric charge is again injected into the memory cell region. In a case where no change is voltage is detected, i.e., the information is "0", the electric potential of the memory cell is restored to a positive value after the same period as that of information "1". The positive electric potential of the doped layer 14 (FIG. 5) is unchangeably maintained because no electric charge has been injected into the doped layer 14.

Accordingly, the minority carriers are definitely excluded from the memory cell region, while the previously stored electric charge is returned into the memory cell, and, furthermore, the electric charge previously not stored, is not injected into the memory cell.

What we claim is:

1. A semiconductor memory device for reading and writing data in response to selected input signals, comprising in combination:
   a semiconductor material substrate having a first conductivity and including, adjacent to a given surface thereof, a doped region of a second conductivity opposite to said first conductivity, and further including a gate region adjacent to said doped region, and a memory cell region adjacent to said gate region and remote from said doped region;
   memory cell electrode means disposed above said given surface and above said memory cell region, and responsive to said selected input signals for respectively assuming one of a plurality of potentials;
   gate electrode means disposed above said given surface and above said gate region, and responsive to said selected input signals for respectively assuming one of said plurality of potentials; and
   insulation means between said memory cell and gate electrode means, and said substrate, for electrically shielding the latter from the former;
   said gate electrode means including, immediately adjacent to said memory cell electrode means, a resistive means for establishing a linear potential transition from the potential of said gate electrode means to that of said memory cell electrode means;
   whereby, in response to said selected input signals, electrical charge is selectably transferred to and from said doped region, respectively, from and to said memory cell region, in a speedy manner.

2. The device of claim 1 including respective terminal means connected to said memory cell electrode means and to said gate electrode means, respectively, for conveying said selected input signals thereto.

3. The device of claim 1 including output means connected to said substrate in the vicinity of said doped region for carrying a read/write indicator signal therefrom.

4. The device of claim 3 wherein said output means includes an output terminal, and amplifier means connected thereto for detecting the potential of said doped region whereby to derive said read/write indicator signal.

5. The device of claim 1 wherein said gate electrode means is a silicon layer.

6. The device of claim 1 wherein said memory cell electrode means is a silicon layer.

7. The device of claim 1 wherein said insulation means is a $SiO_2$ layer.

8. The device of claim 1 including an additional insulating layer overlying said memory cell electrode means and said gate electrode means, said additional insulating layer having an opening over each of said memory cell and gate electrode means for allowing the respective connection of electrical terminals thereto.

* * * * *

UNITED STATES PATENT OFFICE
CERTIFICATE OF CORRECTION

Patent No. 4,060,796   Dated November 29, 1977

Inventor(s) Ryoiku Togei et al

It is certified that error appears in the above-identified patent and that said Letters Patent are hereby corrected as shown below:

Column 4, line 40, delete "er" and substitute: --solution of HF. The removal of $SiO_2$ simultaneously takes place with regard to the $SiO_2$ layer 8, the exposed part of the $SiO_2$ layer 4. A part 16 (Fig. 4) of the $SiO_2$ layer 6 (Fig. 3),--.
Column 6, line 55, "$N^{30}$-type" should be --$N^+$-type--.
Column 7, line 11, "$N^{30}$-type" should be --$N^+$-type--.
Column 7, line 17, "is" (first occurrence) should be --in--.

Signed and Sealed this

Eighteenth Day of April 1978

[SEAL]

Attest:

RUTH C. MASON
Attesting Officer

LUTRELLE F. PARKER
Acting Commissioner of Patents and Trademarks